United States Patent
Ahn et al.

(10) Patent No.: US 6,944,737 B2
(45) Date of Patent: Sep. 13, 2005

(54) MEMORY MODULES AND METHODS HAVING A BUFFER CLOCK THAT OPERATES AT DIFFERENT CLOCK FREQUENCIES ACCORDING TO THE OPERATING MODE

(75) Inventors: Young-man Ahn, Kyungki-do (KR); Jin-ho So, Kyungki-do (KR); Byung-se So, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 404 days.

(21) Appl. No.: 10/094,448

(22) Filed: Mar. 8, 2002

(65) Prior Publication Data

US 2002/0135394 A1 Sep. 26, 2002

(30) Foreign Application Priority Data

Mar. 9, 2001 (KR) ........................................ 2001-12248

(51) Int. Cl.[7] .............................................. G06F 12/00
(52) U.S. Cl. ...................... 711/167; 711/168; 714/718; 714/744; 365/194; 365/233
(58) Field of Search ........................... 711/167; 714/718, 714/719, 744; 365/194, 201, 230.03, 233

(56) References Cited

U.S. PATENT DOCUMENTS

| 4,894,830 | A | * | 1/1990 | Kawai | 714/731 |
| 5,402,458 | A | * | 3/1995 | Moughanni et al. | 377/29 |
| 6,069,829 | A | * | 5/2000 | Komai et al. | 365/201 |
| 6,185,703 | B1 | * | 2/2001 | Guddat et al. | 714/718 |
| 6,331,958 | B2 | * | 12/2001 | Tsukude | 365/201 |
| 6,658,611 | B1 | * | 12/2003 | Jun | 714/719 |
| 6,894,945 | B2 | * | 5/2005 | Sawada | 365/233 |

* cited by examiner

*Primary Examiner*—Nasser Moazzami
(74) *Attorney, Agent, or Firm*—Myers Bigel Sibley & Sajovec

(57) ABSTRACT

Memory modules and methods of testing memory modules are provided that include at least one memory device responsive to a memory clock signal having a memory clock frequency and a data buffer. The data buffer is responsive to a buffer clock signal having a first buffer clock frequency that is different from the memory clock frequency during a normal mode of operation and having a second buffer clock frequency that is equal to the memory clock frequency during a test mode of operation.

11 Claims, 8 Drawing Sheets

MEMORY MODULES AND METHODS HAVING A BUFFER CLOCK THAT OPERATES AT DIFFERENT CLOCK FREQUENCIES ACCORDING TO THE OPERATING MODE

RELATED APPLICATION

This application is related to and claims priority from Korean Application No. 2001-12248, filed Mar. 9, 2001, the disclosure of which is hereby incorporated herein by reference.

FIELD OF THE INVENTION

The present invention relates to integrated circuit devices and methods of operating the same and, more particularly, to memory modules and methods of testing the same.

BACKGROUND OF THE INVENTION

A conventional memory module may include both memory devices and one or more data buffers and may operate at a double data rate (DDR). If the data rate of data input into the data buffer is different from that of the data output from the data buffer, the frequency of an operating clock for the data buffer may be different from the frequency of an operating clock for the memory devices during a normal mode of operation. Typically, during a normal mode operation, the frequency of the operating clock for the data buffer is at least twice the frequency of the operating clock for the memory devices.

Accordingly, in order to test the memory devices in a test mode of operation, a tester may need to operate using the frequency of the operating clock for the data buffer, thus, a high speed tester is typically used. However, the use of a high speed tester may increase test costs and, therefore, increasing the manufacturing costs of a memory module.

Referring now to FIG. 1, a block diagram illustrating a conventional memory module will be discussed. In a conventional memory module the frequency of a buffer clock signal CK_BUFFER, which is an operating clock for a data buffer 15, may be twice the frequency of a memory clock signal CK_MEMORY, which is an operating clock for first and second memory devices 11 and 13 during a normal mode of operation.

As illustrated in FIG. 1, the conventional memory module 100 includes first and second Dynamic Random Access Memories (DRAMs) 11 and 13 and a data buffer 15. The first and second DRAMs 11 and 13 input and/or output data in response to a memory clock signal CK_MEMORY. The data buffer 15 buffers write data input using an input/output pin DQ, and outputs the write data to the first and second DRAMs 11 and 13 in response to a buffer clock signal CK_BUFFER during a normal mode of operation. The data buffer 15 also buffers read data output from the first and second DRAMs 11 and 13 and outputs the read data to the input/output pin DQ in response to a buffer clock CK_BUFFER during a normal mode of operation. The data buffer 15 includes first through fourth registers (151–154), first through fourth delay units (155–158), and a multiplexer 159.

During a write operation, the first register 151 samples the write data input through the input/output pin DQ in response to a rising edge of the buffer clock CK_BUFFER, and the second register 152 samples the write data input through the input/output pin DQ in response to a falling edge of the buffer clock CK_BUFFER. As shown in FIG. 2, a timing diagram illustrating write operations of the memory module of FIG. 1, write data DI0 and DI2 is output REG0_Q from the first register 151, and the write data DI1 and DI3 is output REG1_Q from the second register 152.

Output REG0_Q of the first register 151 is delayed 1½ cycles of the buffer clock CK_BUFFER by a first delay unit 155, and delayed data MIO0_Q is input into the first DRAM 11 at a rising and/or falling edge of the memory clock signal CK_MEMORY. Similarly, output REG1_Q of the second register 152 is delayed 1 cycle of the buffer clock CK_BUFFER by a second delay unit 156, and delayed data MIO1_Q is input into the second DRAM 13 at a rising and/or falling edge of the memory clock signal CK_MEMORY.

Now referring to FIG. 3, a timing diagram of a read operation of the memory module of FIG. 1 will be discussed. During a read operation, read data MIO0_Q, i.e., DO0 and DO2, is output from the first DRAM 11 at a rising and/or falling edge of the memory clock signal CK_MEMORY, and read data MIO1_Q, i.e., DO1 and DO3, is output from the second DRAM 13. Read data DO0 and DO2 is delayed ½ a cycle of the buffer clock CK_BUFFER by a third delay unit 157, and read data DO1 and DO3 is delayed 1 cycle of the buffer clock CK_BUFFER by a fourth delay unit 158.

Output REG2_D of the third delay unit 157 is sampled as output REG2_Q at a rising edge of the buffer clock CK_BUFFER by the third register 153, and output REG3_D is sampled as output REG3_Q at a falling edge of the buffer clock CK_BUFFER by the fourth register 154. The multiplexer 159 selects output REG2_Q at a rising edge of the buffer clock CK_BUFFER or output REG3_Q at a falling edge of the buffer clock CK_BUFFER and outputs REG2_Q or REG3_Q to the input/output pin DQ.

As described above, in order to test conventional memory modules, for example, the memory module of FIG. 1, the tester typically operates using the frequency of the buffer clock CK_BUFFER. However, the frequency of the buffer clock CK_BUFFER is typically at least twice the frequency of the memory clock signal CK_MEMORY, thus, a high-speed tester is typically used. The use of a high speed tester for a conventional memory module may increase test costs and, therefore, increasing the manufacturing costs of a memory module.

SUMMARY OF THE INVENTION

Embodiments of the present invention provide memory modules and methods of testing memory modules. Memory modules according to embodiments of the present invention include at least one memory device responsive to a memory clock signal having a memory clock frequency and a data buffer. The data buffer is responsive to a buffer clock signal having a first buffer clock frequency that is different from the memory clock frequency during a normal mode of operation and having a second buffer clock frequency that is the same as the memory clock frequency during a test mode of operation.

In some embodiments of the present invention the first buffer clock frequency is at least double the memory clock frequency. Memory modules may include a plurality of memory devices and the data buffer may be configured to test each of the plurality of memory devices separately or simultaneously during the test mode of operation.

In further embodiments of the present invention the data buffer may include a write circuit and a read circuit. The write circuit may include a plurality of write registers responsive to a rising and/or falling edge of the first buffer clock signal and a plurality of write control buffers that transmit a plurality of write signals from the plurality of write registers. The write circuit may further include a write switch that couples and/or decouples the plurality of write control buffers responsive to a test enable signal and a plurality of write delay units that delay the plurality of write signals. Finally the write circuit may include a plurality of write selectors that select a first of the plurality of write delay units during the normal mode of operation and select a second of the plurality of write delay units during the test mode of operation.

The read circuit may include a plurality of read delay units that receive a plurality of read signals from the plurality of memory devices and a plurality of read selectors that select a first of the plurality of read delay units during normal mode of operation and select a second of the plurality of read delays units during test mode of operation. The read circuit may further comprise a plurality of read control buffers that transmit the plurality of read signals from the plurality of read selectors and a read switch that couples and/or decouples the plurality of read control buffers in response to the test enable signal. The read circuit may finally include a plurality of read registers that receives the plurality of read signals from the plurality of read control buffers responsive to the rising edge and/or the falling edge of the first buffer clock signal.

In still further embodiments of the present invention, the data buffer may include a write circuit and a read circuit. The write circuit may include a plurality of write registers responsive to a rising and/or falling edge of the first buffer clock signal and a plurality of write control buffers that transmit a plurality of write signals from the plurality of write registers. The write circuit may further include a switch that couples and/or decouples the plurality of write control buffers responsive to a test enable signal and a plurality of write delay units that delay the plurality of write signals. The write circuit may finally include a plurality of write selectors that select a first of the plurality of write delay units during the normal mode of operation and select a second of the plurality of write delay units during the test mode of operation.

The read circuit may include a plurality of read delay units that receive a plurality of read signals from the plurality of memory devices and a first plurality of read selectors that select a first of the plurality of read delay units during normal mode of operation and select a second of the plurality of read delays units during test mode of operation. The read circuit may further include a device the performs a boolean operation on the plurality of read signals from the plurality of read selectors and a second plurality of read selectors that select an output of the device. The read circuit may finally include a plurality of read registers that receives the output of the device from the second plurality of read selectors.

In some embodiments of the present invention a method of testing memory modules is provided including setting a frequency of a buffer clock signal equal to a frequency of a memory clock signal during a test mode of operation of the memory module. The frequency of the buffer clock signal is at least double the frequency of the memory clock signal during a normal mode of operation.

DETAILED DESCRIPTION OF EMBODIMENTS OF THE PRESENT INVENTION

Figure 1:
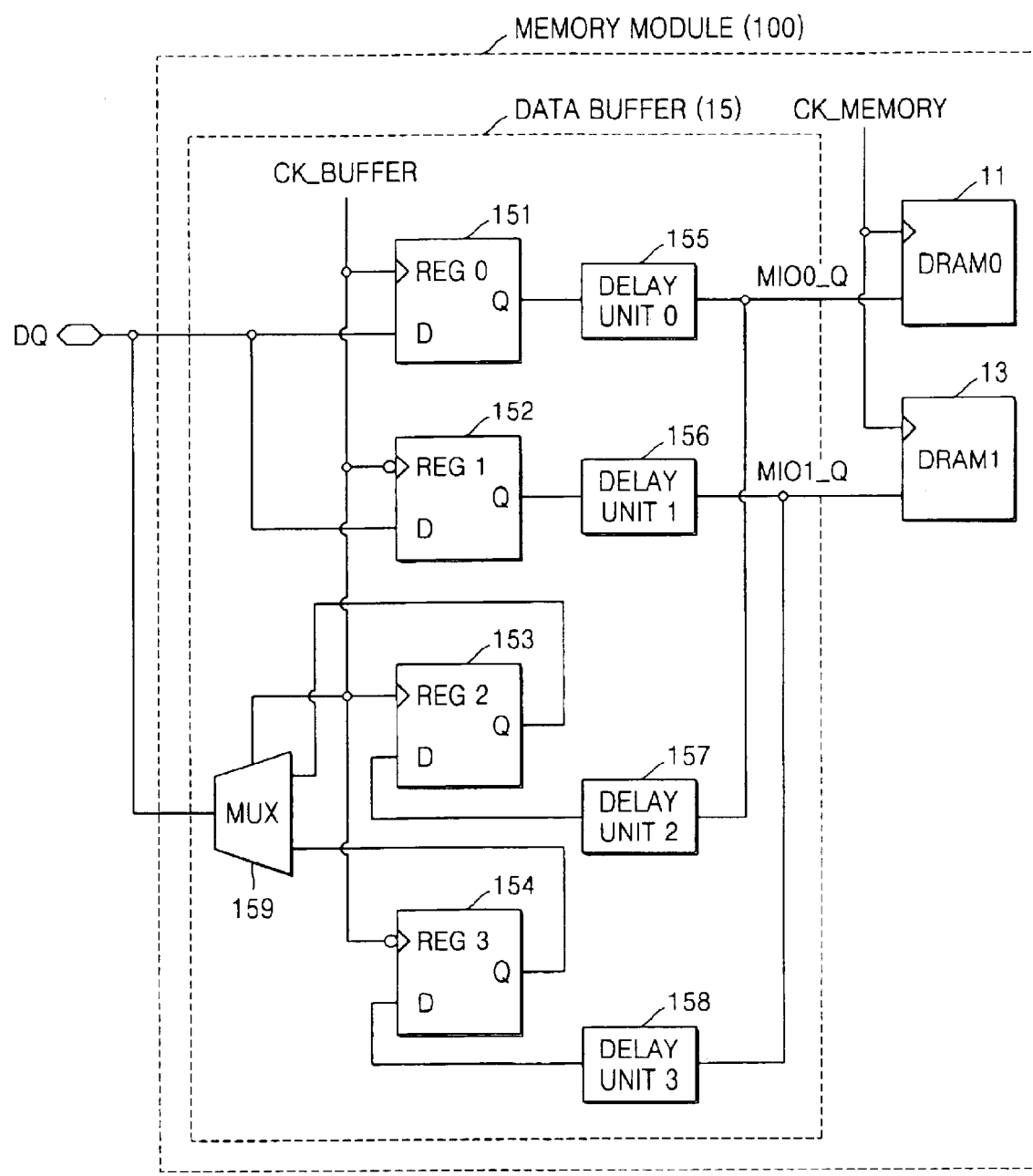
FIG. 1 a block diagram illustrating a conventional memory module.
Figure 2:
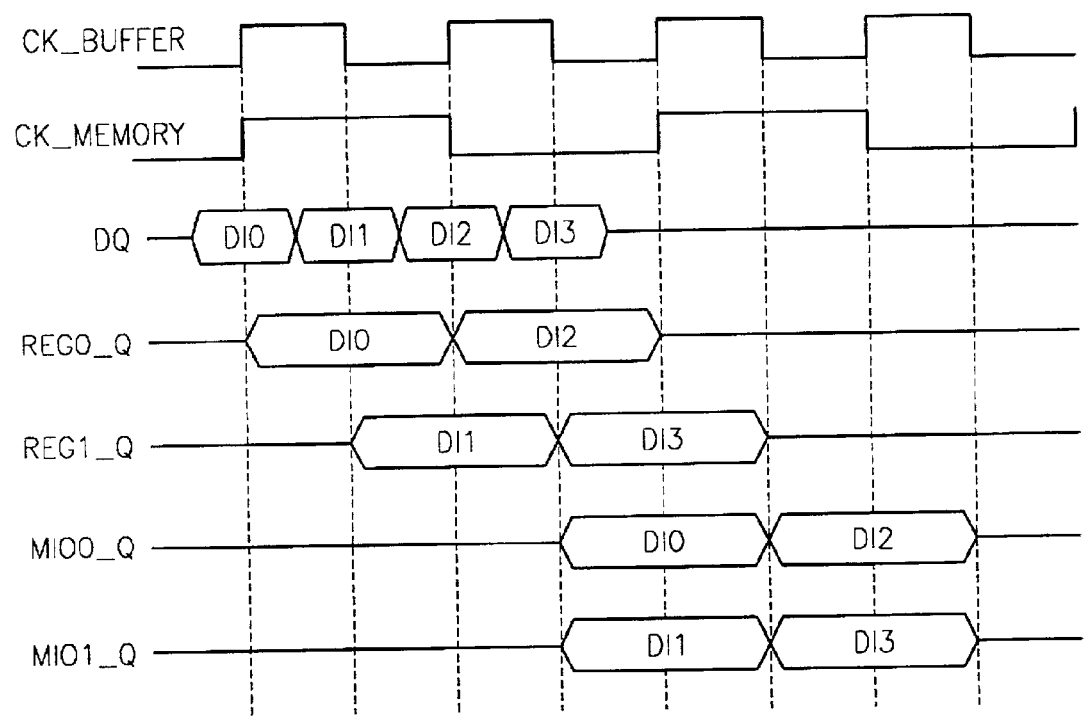
FIG. 2 is a timing diagram illustrating a write operation of the conventional memory module of FIG. 1.
Figure 3:
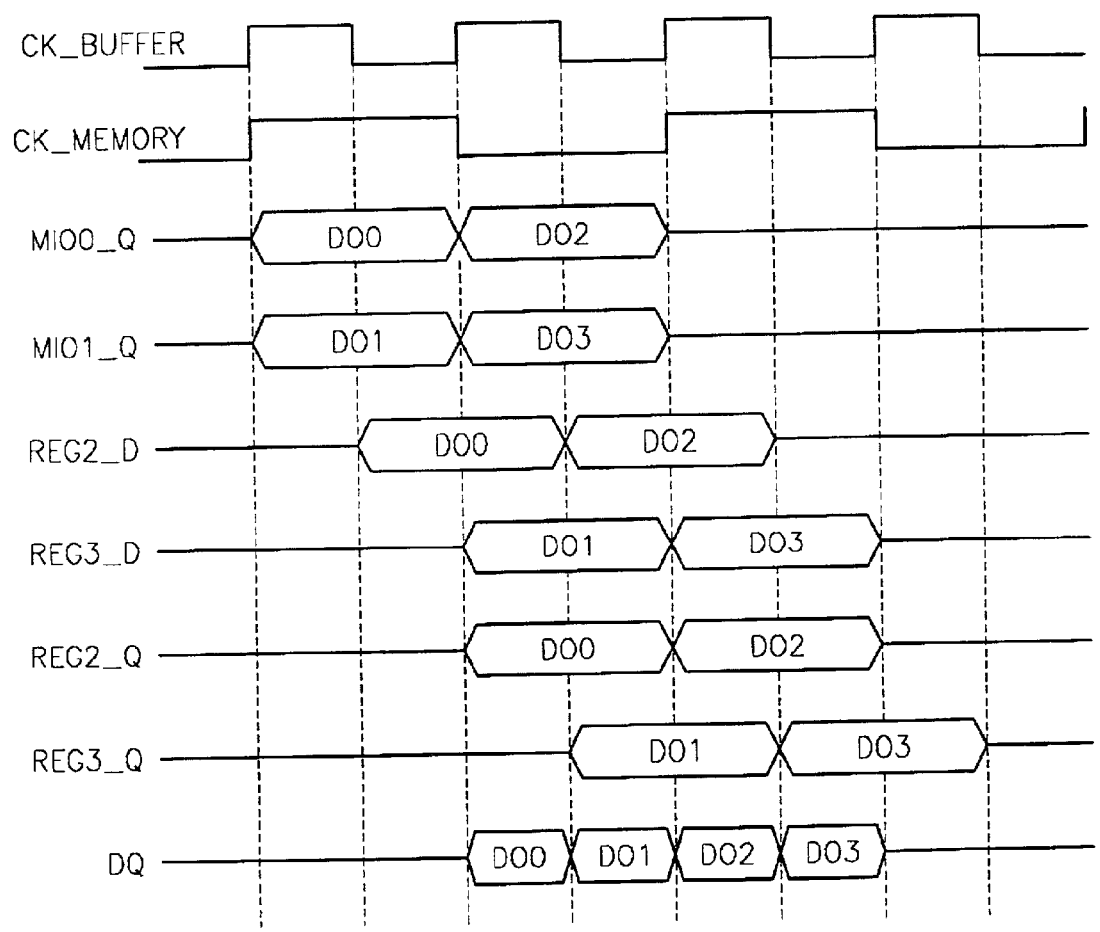
FIG. 3 is a timing diagram illustrating a read operation in the conventional memory module of FIG. 1.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

Embodiments of the present invention will now be described in detail below with reference to FIGS. 4 through 8, which illustrate various embodiments of the present invention and various methods of testing embodiments of the present invention. Memory modules are provided that have the capability of operating in both a normal mode of operation and a test mode of operation. During the test mode of operation, the frequency of a buffer clock may be set equal to the frequency of a memory clock. The memory clock typically operates at a frequency of about half the buffer clock frequency, thus, embodiments of the present invention may provide the capability of testing the memory module at lower speeds than typically available in conventional memory modules.

Now referring to FIG. 4, memory modules according to embodiments of the present invention will be discussed. As illustrated, memory modules 400 according to the embodiments of the present invention include first and second memory devices 41 and 43, and a data buffer 45. Although embodiments of the present invention are illustrated as having only two memory devices, the present invention should not be limited to this configuration. For example, only one memory device may be present or two or more memory devices may be present. The first and second memory devices 41 and 43 may be, for example, dynamic random access memories (DRAMs) and may input and/or output data in response to a memory clock signal CK_MEMORY. The data buffer 45 buffers write data input through an input/output pin DQ, and outputs the write data to the first and second memory devices 41 and 43 in response to a buffer clock signal CK_BUFFER during a normal mode of operation. The data buffer 45 also buffers read data output from the first and second memory devices 41 and 43 and outputs the read data to the input/output pin DQ in response to a buffer clock signal CK_BUFFER during the normal mode of operation.

The data buffer 45 may include a control circuit capable of operating the first and second memory devices 41 and 43. Furthermore, the data buffer 45 may use the same clock frequency to test the first and second memory devices 41 and 43 during a test mode of operation. In particular, the data buffer 45 of FIG. 4 includes first through fourth registers (451–454), first through fourth control buffers (456–459), first through eighth delay units (460–467), first and second switches SW0 and SW1, and first through fifth selectors (468–472) also referred to as multiplexers (MUX). First and second registers 451 and 452, the first and second control buffer 456 and 457, the first through fourth delay units (460–463), the first switch SW0, and the first and second selectors 468 and 469 are used during a write operation. Similarly, third and fourth registers 453 and 454, the third and fourth control buffers 458 and 459, fifth through eighth delay units (464–467), the second switch SW1, and the third through fifth selectors (470–472) are used during a read operation.

The first register 451 samples write data input through an input/output pin DQ in response to a rising edge of the buffer clock signal CK_BUFFER, and the second register 452 samples the write data in response to a falling edge of the buffer clock signal CK_BUFFER.

The first control buffer 456 is typically enabled during the normal mode of operation when a test enable signal TEST is a logic "low", and transmits an output of the first register 451. Furthermore, the first control buffer 456 is enabled during the test mode of operation when the buffer clock signal CK_BUFFER is a logic "low, i.e., in a case where the test enable signal TEST is logic "high", and transmits the output of the first register 451. The first control buffer 456 includes an OR gate 456*a* for receiving an inverted signal of a test enable signal TEST and an inverted signal of the buffer clock signal CK_BUFFER and includes a tri-state buffer 456*b*.

The second control buffer 457 is typically enabled during the normal mode of operation and transmits an output of the second register 452. Furthermore, the second control buffer 457 is enabled during the test mode of operation when the buffer clock signal CK_BUFFER is logic "high" and transmits the output of the second register 452. The second control buffer 457 includes an OR gate 457*a* for receiving an inverted signal of the test enable signal TEST and the buffer clock signal CK_BUFFER and includes a tri-state buffer 457*b*.

The first switch SW0 connects an output terminal of the first control buffer 456 to an output terminal of the second control buffer 457 during the test mode of operation, i.e., when the test enable signal TEST is logic "high". Each of the first delay unit 460 and the second delay unit 461 delays a signal of the output terminal of the first control buffer 456. The first selector 468 selects an output signal of the first delay unit 460 during the normal mode of operation and selects an output signal of the second delay unit 461 during the test mode of operation to output the selected output signal to the first memory device 41.

The third delay unit 462 and the fourth delay unit 463 delays a signal of the output terminal of the first control buffer 457. The second selector 469 selects an output signal of the third delay unit 462 during the normal mode of operation and selects an output signal of the fourth delay unit 463 during the test mode of operation to output the selected output signal to the second memory device 43.

The fifth delay unit 464 and the sixth delay unit 465 delay read data output from the first memory device 41. The third selector 470 selects an output signal of the fifth delay unit 464 during the normal mode of operation and selects an output signal of the sixth delay unit 465 during the test mode of operation.

The third control buffer 458 is typically enabled during the normal mode of operation and transmits an output of the third selector 470. The third control buffer 458 is enabled during a test mode of operation when a predetermined control signal IDSEL is logic "high" and transmits the output of the third selector 470. The third control buffer 458 includes an OR gate 458*a* for receiving an inverted signal of the test enable signal TEST and the predetermined control signal IDSEL and further includes a tri-state buffer 458*b*.

The seventh delay unit 466 and the eighth delay unit 467 delay read data output from the second memory device 43. The fourth selector 471 selects an output signal of the seventh delay unit 466 during the normal mode of operation and selects an output signal of the eighth delay unit 467 during the test mode of operation.

The fourth control buffer 459 is enabled during the normal mode of operation and transmits an output of the fourth selector 471. The fourth control buffer 459 is enable during the test mode of operation when the control signal IDSEL is logic "low" and transmits the output of the fourth selector 471. The fourth control buffer 459 includes an OR gate 459*a* for receiving an inverted signal of the test enable signal TEST and an inverted signal of the predetermined control signal IDSEL and further includes a tri-state buffer 459*b*.

The second switch SW1 connects an output terminal of the third control buffer 458 to an output terminal of the fourth control buffer 459 during the test mode of operation. The third register 453 samples a signal of the output terminal of the third control buffer 458 in response to a rising edge of the buffer clock signal CK_BUFFER, and the fourth register 454 samples a signal of the output terminal of the fourth control buffer 459 in response to a falling edge of the buffer clock signal CK_BUFFER. The fifth selector 472 selects an output of the third register 453 at a rising edge of the buffer clock signal CK_BUFFER and selects an output of the fourth register 454 at a falling edge of the buffer clock signal CK_BUFFER.

Figure 5:
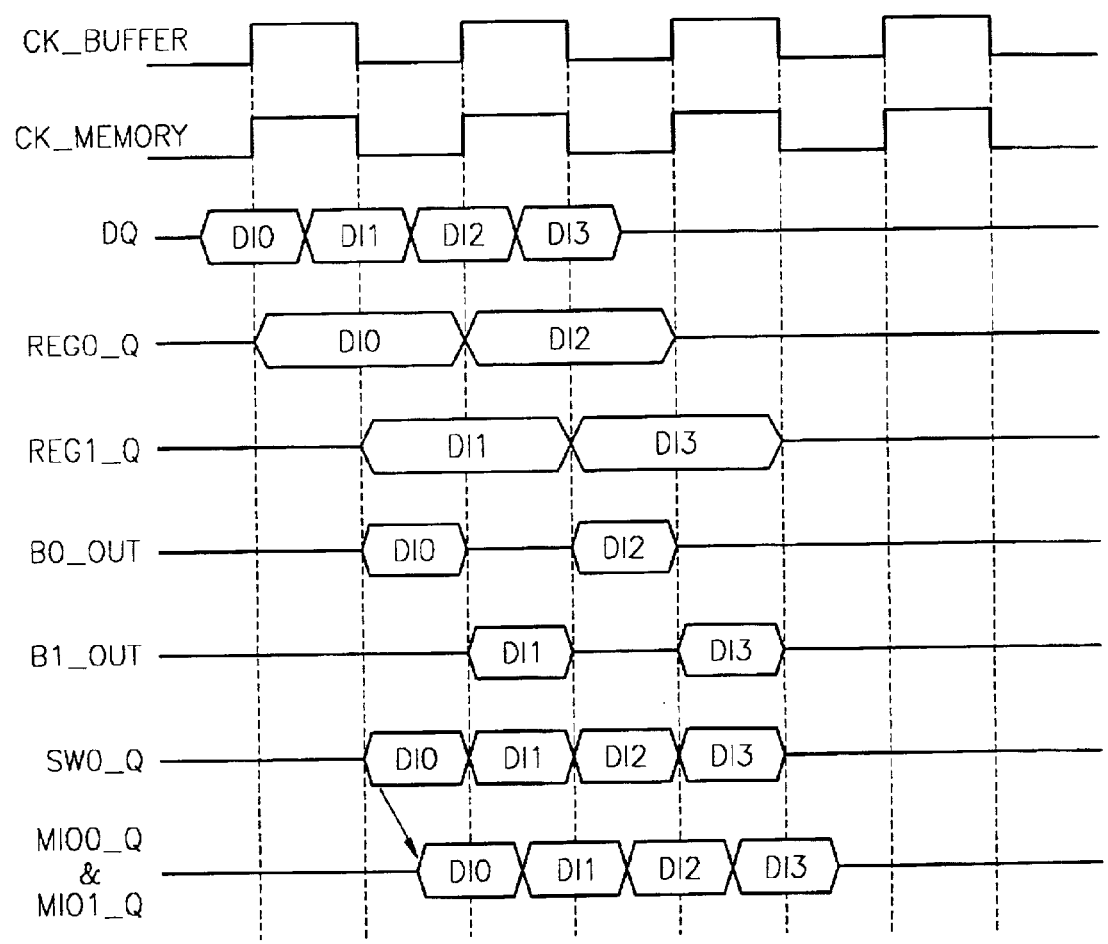
FIG. 5 is a timing diagram illustrating a write operation of a test mode of operation in memory modules of FIG. 4 according to embodiments of the present invention.
Figure 6:
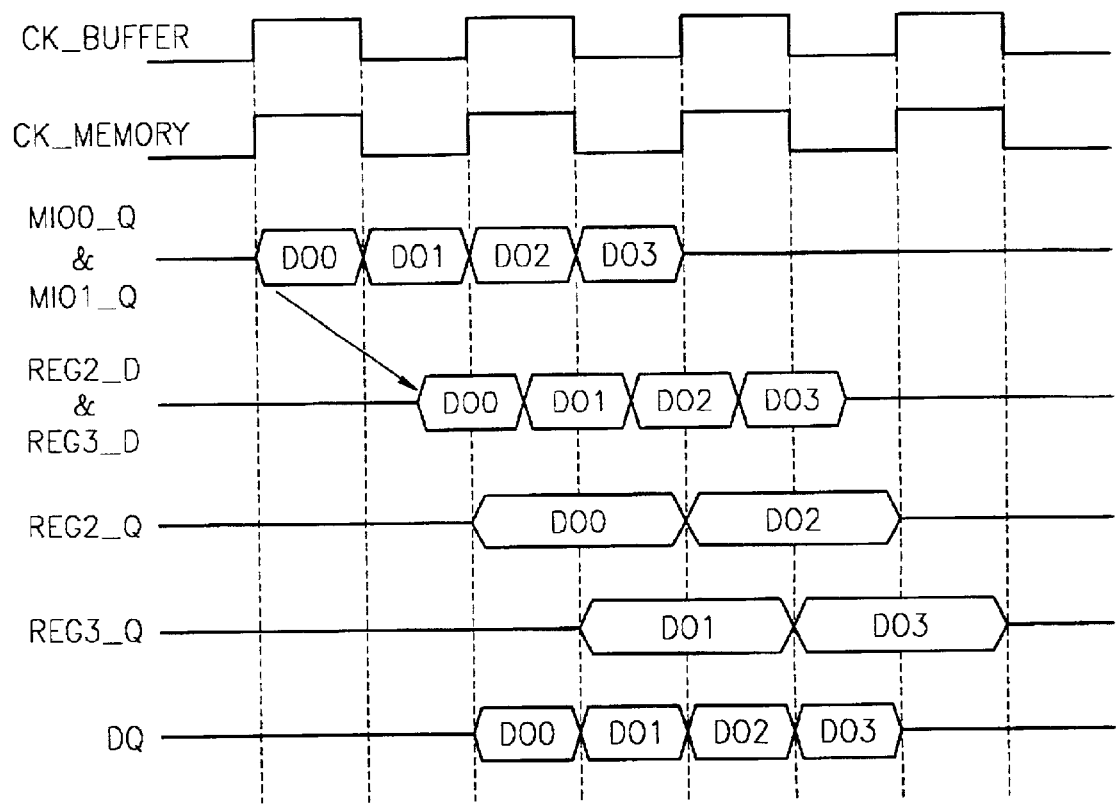
FIG. 6 is a timing diagram illustrating a read operation of the test mode of operation in memory modules of FIG. 4 according to embodiments of the present invention.

Now referring to the timing diagrams of FIGS. 5 and 6, operations of the memory module 400 according to embodiments of the present invention will be described further below. During the normal mode of operation, the test enable signal TEST is logic "low". As a result, the first through fourth control buffers (456–459) are enabled, and the first and second switches SW0 and SW1 are turned off. Output signals of the first, third, fifth, and seventh delay units 460, 462, 464, and 466 are selected by the first through fourth selectors (468–471). Thus, the normal mode of operation of memory modules according to embodiments of the present invention may be similar to the normal mode of operation of conventional devices.

Now referring to FIG. 5, a timing diagram illustrating write operations of memory modules according to embodiments of the present invention, for example, memory modules 400 of FIG. 4, will be discussed further below. During the test mode of operation, the test enable signal TEST is logic "high". As a result, the first and second switches SW0 and SW1 are turned on. Furthermore, the output signals of the second, fourth, sixth, and eighth delay units 461, 463, 465, and 467 are selected by the first through fourth selectors (468–471).

During the write operation, the first register 451 samples write data input through the input/output pin DQ in response to a rising edge of the buffer clock signal CK_BUFFER, and the second register 452 samples the write data input through the input/output pin DQ in response to a falling edge of the buffer clock signal CK_BUFFER. Thus, as shown in the timing diagram of FIG. 5, the write data DI0 and DI2 is the output REG0_Q of the first register 451, and the write data DI1 and DI3 is output REG1_Q of the second register 452.

The first control buffer 456 transmits the output REG0_Q of the first register 451 to output B0_OUT when the buffer clock signal CK_BUFFER is logic "low" during the test mode of operation, and the second control buffer 457 transmits the output REG1_Q of the second register 457 to output B1_OUT when the buffer clock signal CK_BUFFER is logic "high" during the test mode of operation. Meanwhile, during the test mode of operation, the first switch SW0 is turned on and connects the output terminal of the first control buffer 456 to the output of the second control buffer 457 and, thus, the output B0_OUT of the first control buffer 456 is merged into the output B1_OUT of the second control buffer 457.

Merged data SW0_Q is delayed ¼ of a cycle of the buffer clock signal CK_BUFFER through the second delay unit 461, and delayed data MIO0_Q is input into the first memory device 41 at a rising and/or falling edge of the memory clock signal CK_MEMORY. Furthermore, the merged data SW0_Q is delayed ¼ of a cycle of the buffer clock signal CK_BUFFER through the fourth delay unit 463, and delayed data MIO1_Q is input into the second memory device 43 at a rising and/or falling edge of the memory clock signal CK_MEMORY.

Now referring to FIG. 6, a timing diagram of a read operation of memory modules according to embodiments of the present invention will be discussed further below. Read data MIO0_Q is output from the first memory device 41 at a rising and/or falling edge of the memory clock signal CK_MEMORY, and the read data MIO1_Q is output from the second memory device 43 at a rising and/or falling edge of the memory clock signal CK_MEMORY. The read data MIO0_Q is delayed ¾ of a cycle of the buffer clock signal CK_BUFFER through the sixth delay unit 465, and the read data MIO1_Q is delayed ¾ of a cycle of the buffer clock signal CK_BUFFER through the eighth delay unit 467.

When the control signal IDSEL is logic "high", the third control buffer 458 is enabled, and the fourth control buffer 459 is disabled. Thus, only the data MIO0_Q read from the first memory device 41 is output to the input/output pin DQ. When the control signal IDSEL is logic "low", the third control buffer 458 is disabled, and the fourth control buffer 459 is enabled. Thus, only the data MIO1_Q read from the second memory device 43 is output to the input/output pin DQ.

When the control signal IDSEL is logic "high", output of the sixth delay unit 465 is an input signal REG2_D of the third register 453 through the selector 470 and the third control buffer 458. Here, the second switch SW1 is turned on, and thus the output of the sixth delay unit 465 is an input signal REG3_D of the fourth register 454. When the control signal IDSEL is logic "low", output of the eighth delay unit 467 is an input signal REG3_D of the fourth register 454 through the selector 471 and the fourth control buffer 459. Here, the second switch SW1 is turned on, and thus the output of the eighth delay unit 467 is an input signal REG2_D of the third register 453.

The input signal REG2_D is sampled as output REG2_Q at a rising edge of the buffer clock signal CK_BUFFER by the third register 453, and the input signal REG3_D is sampled as output REG3_Q at a falling edge of the buffer clock signal CK_BUFFER by the fourth register 454. The fifth selector 472 selects the output REG2_Q at a rising edge of the buffer clock signal CK_BUFFER, selects the output REG3_Q at a falling edge of the buffer clock signal CK_BUFFER, and thus outputs REG2_Q and REG3_Q to the input/output pin DQ.

Memory modules according embodiments of the present invention described above can be tested by setting the frequency of the buffer clock signal CK_BUFFER equal to the frequency of the memory clock signal CK_MEMORY during the test mode of operation. The first and second memory devices 41 and 43 can be separately tested, but may not be simultaneously tested in these embodiments.

Figure 7:
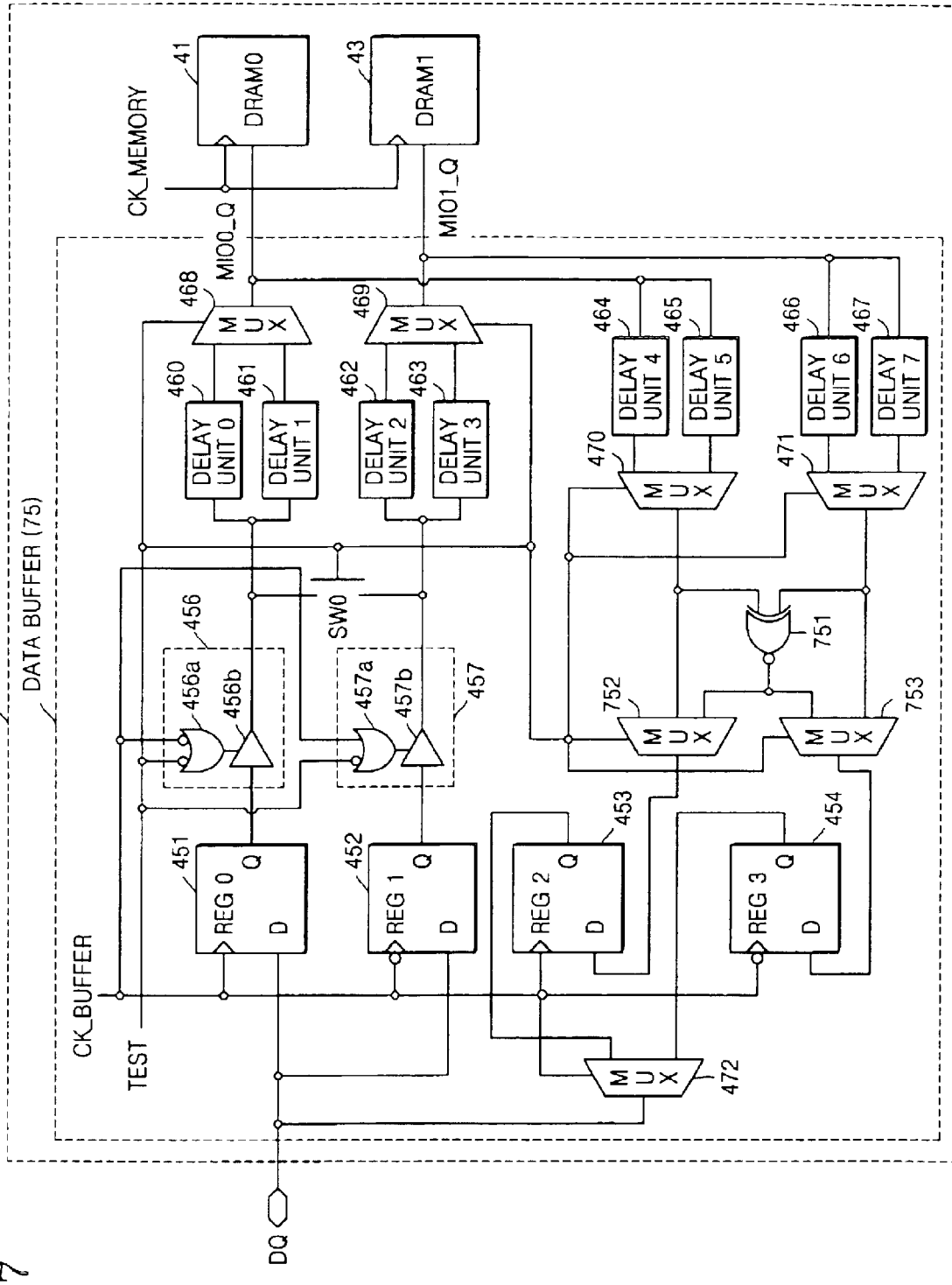
FIG. 7 is a block diagram illustrating memory modules according to further embodiments of the present invention.

Now referring to FIG. 7, memory modules according to further embodiments of the present invention will be discussed below. Memory modules of FIG. 7 have been supplemented so that the first and second memory devices 41 and 43 can be simultaneously tested. As illustrated, the memory module 700 includes first and second memory devices 41 and 43, and a data buffer 75. The data buffer 75 includes an exclusive NOR gate 751 and selectors 752 and 753 in place of the third and fourth control buffers 458 and 459 and the second switch SW1 included in the embodiment of FIG. 4. Like reference numerals throughout the drawings refer to the like elements with respect to the memory module of FIG. 4.

Figure 4:
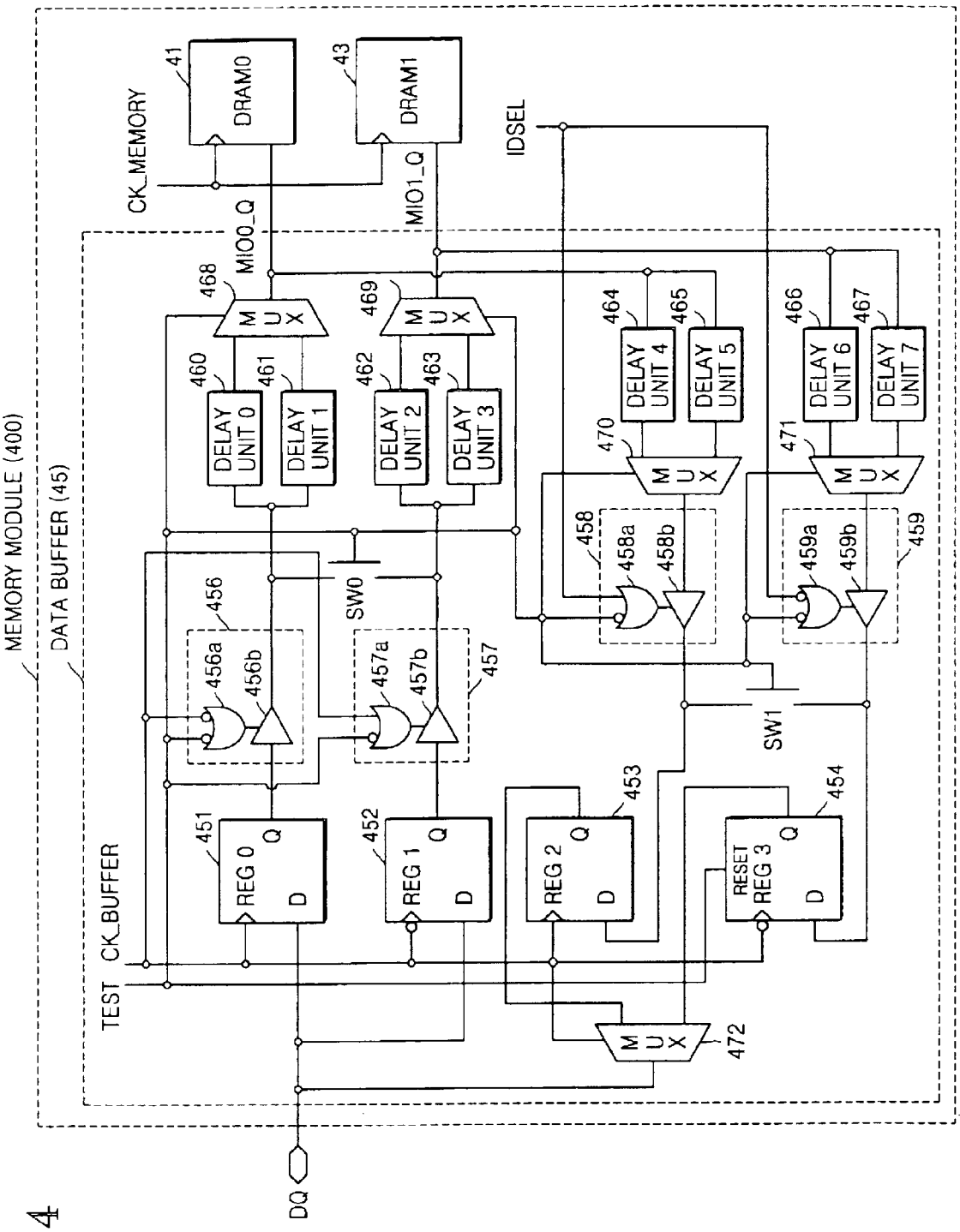
FIG. 4 is a block diagram illustrating memory modules according to embodiments of the present invention.

Write operations in a normal mode of operation are the same as the operations discussed with respect to FIG. 4, thus, a description of these operations will be omitted. During a read operation in the normal mode of operation, the selector 752 selects an output signal of the fifth delay unit 464 selected by the selector 470 and outputs the output signal of the fifth delay unit 464 to the third register 453, and the selector 753 selects an output signal of the seventh delay unit 466 selected by the selector 471 and outputs the output signal of the seventh delay unit 466 to the fourth register 454.

During a read operation in the test mode of operation, the exclusive NOR gate 751 performs an exclusive NOR operation on an output signal of the sixth delay unit 465 selected by the selector 470 and an output signal of the eighth delay unit 467 selected by the selector 471. The selector 752 and the selector 753 select an output signal of the exclusive NOR gate 751 and outputs the signal of the exclusive NOR gate 751 to the third register 453 and the fourth register 454.

Figure 8:
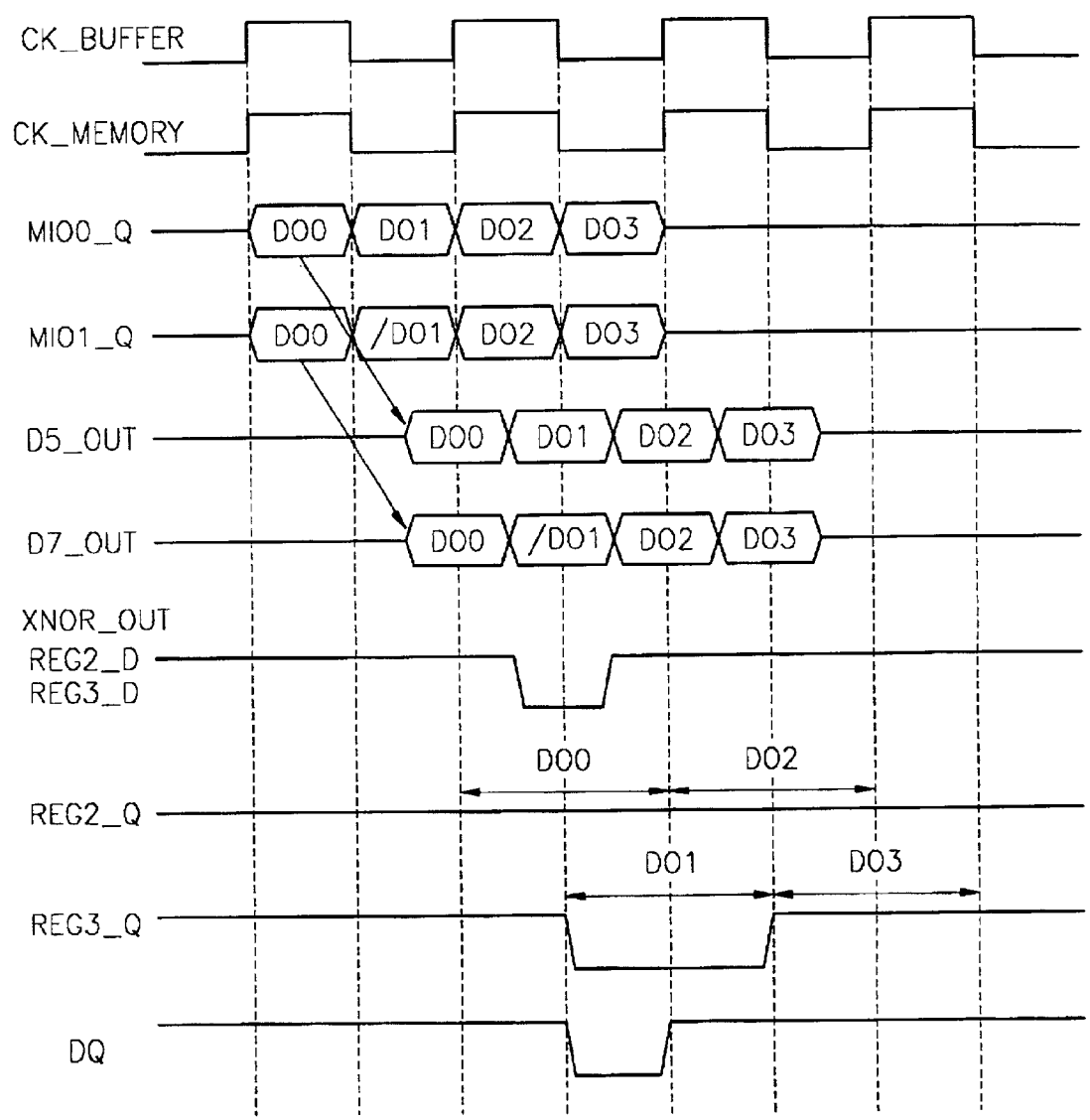
FIG. 8 is a timing diagram illustrating a write operation of the test mode of operation in memory modules of FIG. 7 according to embodiments of the present invention.

Now referring to FIG. 8, a timing diagram illustrating operations of memory modules of FIG. 7 will be discussed below. As illustrated, if an output signal D5_OUT of the sixth delay unit 465, which delays data MIO0_Q read from the first memory device 41, is the same as an output signal D7_OUT of the eighth delay unit 467, which delays data MIO1_Q read from the second memory device 43, the output of the exclusive NOR gate 751 is logic "high". Otherwise, the output of the exclusive NOR gate 751 is logic "low". Thus, if a value finally output to the input/output pin DQ is logic "low", it may be determined that a memory cell corresponding to the values is defective. Thus, embodiments of the present invention illustrated in FIG. 7 may be tested by setting the frequency of the buffer clock signal CK_BUFFER to be the same as that of the memory clock signal CK_MEMORY during the test mode of operation and the first and second memory devices 41 and 43 may be simultaneously tested.

It will be understood that although embodiments of the present invention have been described where the frequency of the buffer clock signal CK_BUFFER is twice the frequency of the memory clock signal CK_MEMORY during the normal mode of operation, embodiments of the present invention may also be applied to cases where the frequency of the buffer clock signal CK_BUFFER is, for example, four times, six times, and more than sixteen times the frequency of memory clock signal CK_MEMORY.

As described above, memory modules and methods of testing memory modules according to embodiments of the present invention provide both a normal mode of operation and a test mode of operation. During the test mode of operation, the frequency of a buffer clock, which is typically at least 2 times the frequency of a memory clock, may be set equal to the frequency of the memory clock signal. Thus, the test may be performed at a fairly low speed. Thus, according to embodiments of the present invention memory modules may be tested and manufactured at a reduced cost.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A memory module, comprising:
   at least one memory device responsive to a memory clock signal having a memory clock frequency; and
   a data buffer responsive to a buffer clock signal having a first buffer clock frequency that is different from the memory clock frequency during a normal mode of operation and having a second buffer clock frequency that is equal to the memory clock frequency during a test mode of operation, wherein the data buffer comprises:
   a write circuit, comprising:
      a plurality of write registers responsive to a rising and/or falling edge of the first buffer clock signal;
      a plurality of write control buffers that transmit a plurality of write signals from the plurality of write registers;
      a write switch that couples and/or decouples the plurality of write control buffers responsive to a test enable signal;
      a plurality of write delay units that delay the plurality of write signals; and
      a plurality of write selectors that select a first of the plurality of write delay units during the normal mode of operation and select a second of the plurality of write delay units during the test mode of operation; and
   a read circuit, comprising:
      a plurality of read delay units that receive a plurality of read signals from the plurality of memory devices;
      a plurality of read selectors that select a first of the plurality of read delay units during normal mode of operation and select a second of the plurality of read delays units during test mode of operation;
      a plurality of read control buffers that transmit the plurality of read signals from the plurality of read selectors;
      a read switch that couples and/or decouples the plurality of read control buffers in response to the test enable signal; and
      a plurality of read registers that receives the plurality of read signals from the plurality of read control buffers responsive to the rising edge and/or the falling edge of the first buffer clock signal.

2. A memory module, comprising:
   at least one memory device responsive to a memory clock signal having a memory clock frequency; and
   a data buffer responsive to a buffer clock signal having a first buffer clock frequency that is different from the memory clock frequency during a normal mode of operation and having a second buffer clock frequency that is equal to the memory clock frequency during a test mode of operation, wherein the data buffer comprises:
   a write circuit, comprising:
      a plurality of write registers responsive to a rising and/or falling edge of the first buffer clock signal;
      a plurality of write control buffers that transmit a plurality of write signals from the plurality of write registers;
      a switch that couples and/or decouples the plurality of write control buffers responsive to a test enable signal;
      a plurality of write delay units that delay the plurality of write signals; and
      a plurality of write selectors that select a first of the plurality of write delay units during the normal mode of operation and select a second of the plurality of write delay units during the test mode of operation; and
   a read circuit, comprising:
      a plurality of read delay units that receive a plurality of read signals from the plurality of memory devices;
      a first plurality of read selectors that select a first of the plurality of read delay units during normal mode of operation and select a second of the plurality of read delays units during test mode of operation;
      a device the performs a boolean operation on the plurality of read signals from the plurality of read selectors;
      a second plurality of read selectors that select an output of the device; and
      a plurality of read registers that receives the output of the device from the second plurality of read selectors.

3. A memory module comprising:
   a plurality of memory devices that are configured to input and/or output data in response to a memory clock signal; and
   a data buffer that is configured to buffer write data input to output the write data to the memory devices and is further configured to buffer read data output from the memory devices to output the read data, in response to a buffer clock signal having a frequency that is different from that of the memory clock signal during a normal mode; and
   wherein the data buffer includes a control circuit that is configured to operate the memory devices and the data buffer using the same clock frequency to test the memory devices during a test mode and wherein the data buffer comprises:
   a first register that is configured to sample the write data in response to a rising edge of the buffer clock signal;

a second register that is configured to sample the write data in response to a falling edge of the buffer clock signal;

a first control buffer that is configured to transmit output of the first register during the normal mode and further configured to transmit output of the first register only when the buffer clock signal is in a first logic state during the test mode;

a second control buffer that is configured to transmit output of the second register during the normal mode and further configured to transmit output of the second register only when the buffer clock signal is in a second logic state during the normal mode;

a first switch that connects an output terminal of the first control buffer to an output terminal of the second control buffer during the test mode;

a first delay unit that delays a signal of the output terminal of the first control buffer;

a second delay unit that delays the signal of the output terminal of the first control buffer;

a first selector that selects an output signal of the first delay unit during the normal mode and that further selects an output signal of the second delay unit during the test mode to output the selected output signal to a first memory device among the memory devices;

a third delay unit that delays a signal of the output terminal of the second control buffer;

a fourth delay unit that delays the signal of the output terminal of the second control buffer; and a second selector that selects an output signal of the third delay unit during the normal mode and that further selects an output signal of the fourth delay unit during the test mode to output the selected output signal to the second memory device among the memory devices.

4. The memory module of claim 3, wherein the data buffer further comprises:

a fifth delay unit that delays read data output from the first memory device;

a sixth delay unit that delays the read data output from the first memory device;

a third selector that selects an output signal of the fifth delay unit during the normal mode and that further selects an output signal of the sixth delay unit during the test mode;

a third control buffer that transmits output of the third selector during the normal mode and that further transmits output of the third selector only when a control signal is in a second logic state during the test mode;

a seventh delay unit that delays read data output from the second memory device;

an eighth delay unit that delays the read data output from the second memory device;

a fourth selector that selects an output signal of the seventh delay unit during the normal mode and that further selects an output signal of the eighth delay unit during the test mode;

a fourth control buffer that transmits output of the fourth selector during the normal mode and that further transmits output of the fourth selector only when a predetermined control signal is in the first logic state during the test mode;

a second switch that connects an output terminal of the third control buffer to an output terminal of the fourth control buffer during the test mode;

a third register that samples a signal of the output terminal of the third control buffer in response to a rising edge of the buffer clock signal;

a fourth register that samples a signal of the output terminal of the fourth control buffer in response to a falling edge of the buffer clock signal; and a fifth selector that selects output of the third register at a rising edge of the buffer clock signal and that selects output of the fourth register at a falling edge of the buffer clock signal to output the selected output to the input and output pin.

5. The memory module of claim 3, wherein the data buffer further comprises:

a fifth delay unit that delays read data output from the first memory device;

a sixth delay unit that delays the read data output from the first memory device;

a third selector that selects an output signal of the fifth delay unit during the normal mode and that selects an output signal of the sixth delay unit during the test mode;

a seventh delay unit that delays read data output from the second memory device;

an eighth delay unit that delays the read data output from the second memory device;

a fourth selector that selects an output signal of the seventh delay unit during the normal mode and that further selects an output signal of the eighth delay unit during the test mode;

an exclusive NOR gate that receives output of the third selector and output of the fourth selector;

a fifth selector that selects output of the third selector during the normal mode and that further selects output of the exclusive NOR gate during the test mode;

a sixth selector that selects output of the fourth selector during the normal mode and that further selects output of the exclusive NOR gate during the test mode;

a third register that samples output of the fifth selector in response to a rising edge of the buffer clock signal;

a fourth register that samples output of the sixth selector in response to a falling edge of the buffer clock signal; and a seventh selector that selects output of the third register at a rising edge of the buffer clock signal and that further selects output of the fourth register at a falling edge of the buffer clock signal to output the selected output to the input and output pin.

6. The memory module of claim 3, wherein the first logic state is logic "low".

7. The memory module of claim 3, wherein the second logic state is logic "high".

8. A memory module, comprising:

at least one memory device responsive to a memory clock signal having a memory clock frequency; and a data buffer responsive to a buffer clock signal having a first buffer clock frequency that is different from the memory clock frequency during a normal mode of operation and having a second buffer clock frequency that is equal to or different from the memory clock frequency during a test mode of operation, wherein the at least one memory device is a plurality of memory devices and wherein the data buffer is configured to write all input data to each of the plurality of memory devices simultaneously during the test mode of operation.

9. A memory module, comprising:

at least one memory device responsive to a memory clock signal having a memory clock frequency; and a data buffer responsive to a buffer clock signal having a first buffer clock frequency that is different from the memory clock frequency during a normal mode of operation and having a second buffer clock frequency that is equal to or different from the memory clock frequency during a test mode of operation, wherein the at least one memory device is a plurality of memory devices and wherein the data buffer is configured to output read data from all of the plurality of memory devices simultaneously during the test mode of operation.

10. A memory module, comprising:

at least one memory device responsive to a memory clock signal having a memory clock frequency; and a data buffer responsive to a buffer clock signal having a first buffer clock frequency that is different from the memory clock frequency during a normal mode of operation and having a second buffer clock frequency that is equal to or different from the memory clock frequency during a test mode of operation, wherein the at least one memory device is a plurality of memory devices and wherein the data buffer is configured to output read data from each of the plurality of memory devices separately during the test mode of operation.

11. A memory module, comprising:

at least one memory device responsive to a memory clock signal having a memory clock frequency; and a data buffer responsive to a buffer clock signal having a first buffer clock frequency that is different from the memory clock frequency during a normal mode of operation and having a second buffer clock frequency that is equal to or different from the memory clock frequency during a test mode of operation, wherein the at least one memory device is a plurality of memory devices and wherein the data buffer is configured to read data from all of the plurality of memory devices simultaneously, compare the read data and then output a comparison result during the test mode of operation.

* * * * *